United States Patent [19]

Tsuruishi

[11] 3,967,253

[45] June 29, 1976

[54] DISPLAY DEVICE

[75] Inventor: Yuki Tsuruishi, Suwa, Japan

[73] Assignee: Kabushiki Kaisha Suwa Seikosha, Tokyo, Japan

[22] Filed: Oct. 29, 1974

[21] Appl. No.: 518,906

[30] Foreign Application Priority Data

Oct. 29, 1973  Japan.............................. 48-121517

[52] U.S. Cl...................... 340/173 LM; 178/7.3 D; 315/169 R; 340/173.2
[51] Int. Cl.²......................................... G11C 11/42
[58] Field of Search.......... 340/173 LM; 178/7.3 D; 315/169 R, 169 TV

[56]  References Cited
UNITED STATES PATENTS

| 3,132,325 | 5/1964  | Broy............................ | 340/173 LM |
| 3,293,441 | 12/1966 | Kazan........................... | 340/173 LM |
| 3,341,826 | 9/1967  | Lee.............................. | 340/173 LM |
| 3,393,346 | 7/1968  | Lechner........................ | 340/173 LM |
| 3,540,011 | 11/1970 | Stupp........................... | 340/173 LM |
| 3,801,820 | 4/1974  | Eichelberger................ | 340/173 LM |

Primary Examiner—Terrell W. Fears
Attorney, Agent, or Firm—Blum, Moscovitz, Friedman & Kaplan

[57] ABSTRACT

A display device having a first substrate bearing a first electrode and a second substrate bearing a second electrode, and a layer of a display material such as liquid crystal and PLZT (lead-lanthanum-zirconate-titanate ceramics) disposed between the substrates. The second substrate also bears a display cell driving circuit including at least one shift register stage and a radiation-detecting element. The display cell driving circuit is positioned in the region of said second electrode and electrically coupled thereto so that radiation directed at the radiation detecting element from outside of said display device may selectively store data in the display-cell driving circuit and energize the electrodes to render the region of the display material in registration with the second electrode visually distinguishable from the surrounding display material. A plurality of at least the second electrode and associated display cell driving circuit may be provided.

20 Claims, 12 Drawing Figures

DISPLAY DEVICE

BACKGROUND OF THE INVENTION

This invention relates to a display device wherein data may be written on the display device from externally thereof. One such well known device is a cathode ray tube (CRT) display device which permits data to be written thereon by means of a "light pen". The light pen is not independent of the display device, but rather, is coupled thereto and detects light.

A device wherein data can be written into a display from an external source independent of the display has not previously been produced. By the arrangement in accordance with the invention, a display device wherein data can be written into the device by an external radiation source completely independent of the display device is provided.

SUMMARY OF THE INVENTION

Generally speaking, in accordance with the invention, a display device is provided including a first substrate bearing a first electrode, a second substrate bearing at least one second electrode, a display material disposed between said substrates and adapted so that the region thereof in registration with at least the second electrode is rendered visually distinguishable from the adjoining regions of said material upon the selective energization of said electrodes, and display cell driving circuit means on said second substrate in the region of said second electrode. Said display cell driving circuit means includes at least one shift register stage means for storing data and radiation detecting means for detecting selectively applied radiation from outside of said display device for defining an input to said shift register stage means and for energizing said electrodes. A plurality of at least said second electrodes and said display cell driving circuit means are provided on said second substrate, and a single common first electrode may be provided in registration with at least a portion of said second electrodes.

Said second electrodes may be positioned on said substrate in overlapping relationship with the associated display cell driving circuit means. Said display cell driving circuit means may be substantially formed of radiation-transparent materials. In another embodiment, said display cell driving circuit means is formed of integrated circuit elements occupying an area on the substrate substantially less than the area occupied by said overlapping second electrode.

The display cell driving circuit means may include first and second radiation detecting means, each being adapted to detect radiation of a wave length different from the wave length detected by the other of said radiation detecting means, said first and second radiation detecting means being respectively adapted to read into and erase data from the associated shift register means, thereby respectively energizing and de-energizing the associated electrodes.

The display cell driving circuit means may include a memory circuit and external control circuit means may be provided for controlling the operation of said display cell driving circuit means. Said control circuit may include an external memory register and shift register means for storing data from the display cell and for applying data thereto.

Accordingly, an object of the invention is to provide a display device wherein data can be directly written into and erased therefrom through the use of an external radiation or light source.

Still a further object of the invention is to provide an extremely thin, low power display device wherein data can be written into the device through the use of an external light source.

Still other objects and advantages of the invention will in part be obvious and will in part be apparent from the specification and drawings.

The invention accordingly comprises the features of construction, combinations of elements, and arrangements of parts which will be exemplified in the constructions hereinafter set forth, and scope of the invention will be indicated in the claims.

BRIEF DESCRIPTION OF THE DRAWINGS

For a fuller understanding of the invention, reference is had to the following description taken in connection with the accompanying drawings, in which:

Referring now to FIG. 1, one embodiment of the display panel A of the display device in accordance with the invention is depicted. The panel includes a linear polarizer plate 1 mounted on one side of upper substrate 2 formed of glass. A transparent upper electrode 3 is deposited on the other surface of substrate 1. A lower substrate 8 supports, on its lower surface, a linear polarizer plate 9 oriented so that the axis of polarization thereof is at substantially 90° to the axis of polarization of linear polarizer plate 1. A reflector 10 is mounted on the lower surface of linear polarizer plate 9.

Figure 2:
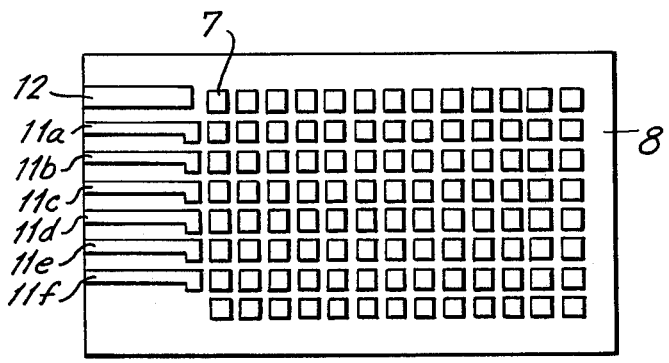
FIG. 2 is a top plan view of the lower substrate of the display cell of FIG. 1 illustrating the orientation of the electrodes thereon.

Lower substrate 8, which is also formed of glass, supports on its upper surface a lower electrode array 7 consisting of a plurality of separate lower electrodes mosaicly arranged in a rectangular array as illustrated in FIG. 2. A sealing member 4 is positioned intermediate substrates 2 and 8 for retaining a liquid crystal display material 5 therebetween, and further defining the thickness of the layer of liquid crystal material. Upper substrate 2 is dimensioned to be narrower than lower substrate 8 so that contacts 11 and 12 extend from within the display cell to the exterior thereof on lower substrate 8 and are available for connection to external circuitry. A conductive connector 6 electrically connects upper electrode 3 with contact 12 (FIG. 2) to provide an external electrical connection thereto. Connector 6 is positioned within the cell adjacent sealing member 4. A plurality of further contacts 11a, 11b, 11c, 11d, 11e and 11f likewise provide external connection to the cell as will be more particularly described below.

Figure 1:
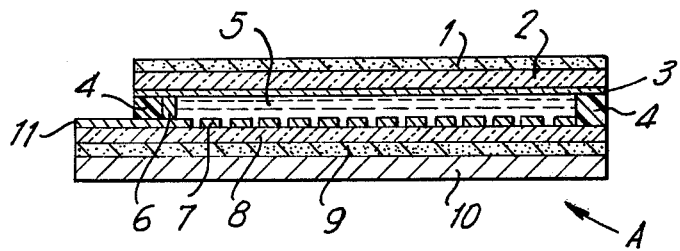
FIG. 1 is a sectional view of one embodiment of the display panel in accordance with the invention.

Liquid crystal material 5 illustrated in the embodiment of FIG. 1, is of the field effective type characterized by high positive dielectric anisotropy and is formed so as to be twisted by 90° between the upper electrode 3 and lower electrode 9. When a voltage is not applied between the upper and lower electrodes, light entering from above the display panel through linear polarization plate 1 passes through the display panel and is reflected by reflector 10 and returned through linear polarizing plate 1 to provide a bright background. On the other hand, when a voltage is applied between selected segments of lower electrode 7 and the common upper electrode 3, the regions of the liquid crystal material 5 in registration with the energized lower electrode segments 7 do not transmit the light so that a dark background is obtained in those regions, rendering those regions visually distinguishable from the adjacent regions of the display. This results from the disorientation of the molecules by the field. If reflector 10 is removed, the panel becomes a transmissive, as opposed to a reflective type display panel. Other display materials may be utilized in place of the liquid crystal material 5 illustrated by way of example FIG. 1. For example, a solid display material such as PLZT can be utilized. Further, the positioning of the segmented electrode 7 as the lower electrode is shown by way of example, and the positions of the upper and lower electrode can be switched.

As noted above, contact portions 11a through 11f connect to signal lines carried by glass substrate 8 and coupled to the respective driving integrated circuits (IC) carried by the glass substrate at each lower electrode segment 7. The signals applied to contacts 11a through 11f may consist, respectively, of a positive power source signal, a negative power source signal, a clock signal, a display signal, a display timing pulse and the output of the last stage. If desired, a contact for receiving an alternating current signal for driving the liquid crystal with alternating current may be provided.

Figure 3:
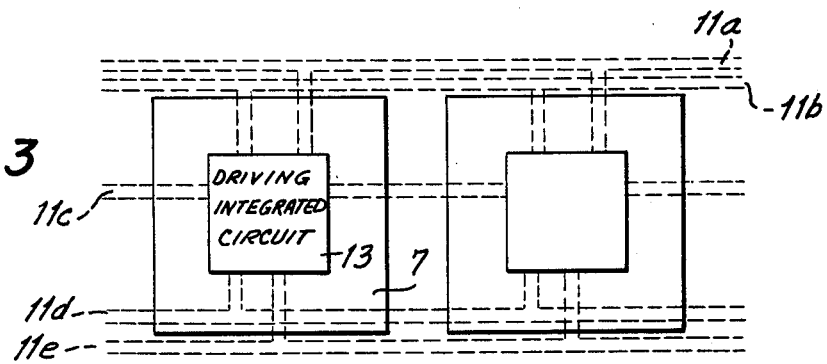
FIG. 3 is an enlarged view of two of the electrodes of FIG. 2 and the associated leads and driving integrated circuits.

An enlarged view of two of the lower electrode segments 7 is shown in FIG. 3, which illustrates integrated circuit block 13 consisting of a transistor IC of the thin film type formed on glass substrate 8 by means of deposition as hereinafter described. Driving integrated circuit 13 is formed of material transmissive to the radiation utilized to energize the display, which radiation, in the instant case, is light. For this reason, although the driving integrated circuit 13 is located centrally of the lower electrode segment 7 and occupies a substantial portion of the area thereof, it does not affect the visibility of the display. The various signal lines coupled to the external contacts 11a through 11e of FIG. 2 are illustrated in FIG. 3 by dashed lines, these signal lines providing the signals to the driving integrated circuit 13 associated with each lower electrode segment 7. If said signal lines are thinned sufficiently and a relatively thick insulating film is provided intermediate said lines (and the integrated circuit block) and the lower electrode segment 7, the electrode segment is not energized by the current on the lines and spurious displays are avoided. Where the signal lines cross, an insulating film would be provided therebetween so as to avoid electrical contact.

Figure 4:
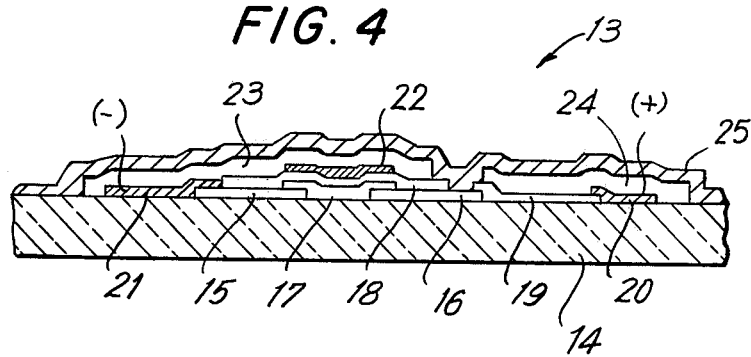
FIG. 4 is a cross sectional view of a thin film integrated circuit incorporated in the driving integrated circuit of FIG. 3.
Figure 5:
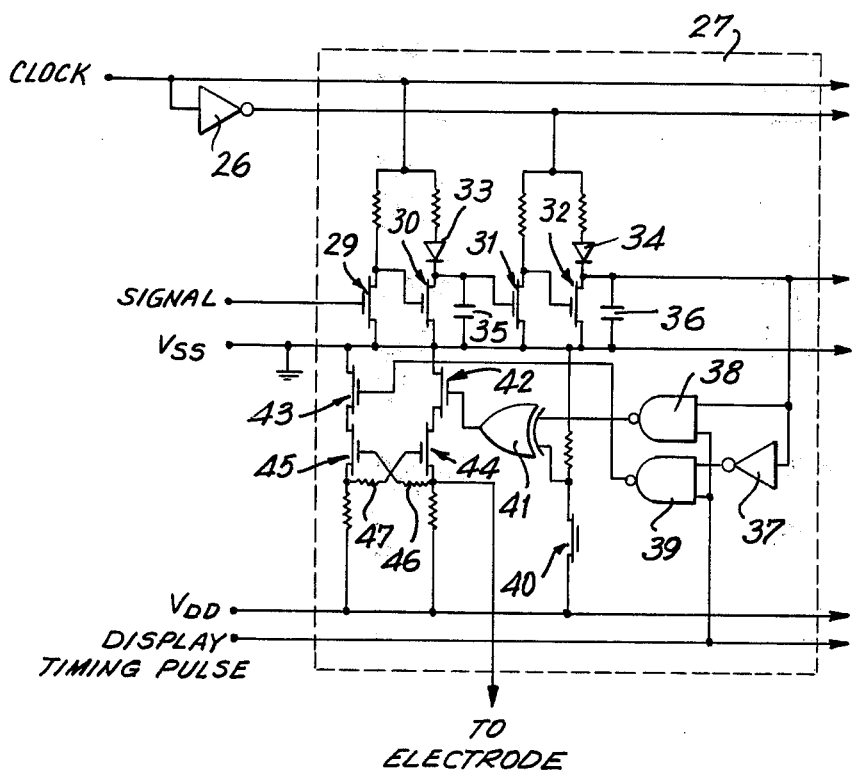
FIG. 5 is a circuit diagram of an integrated circuit block formed in accordance with the construction of FIG. 4 and defining the driving integrated circuit of FIG. 3.
Figure 6:
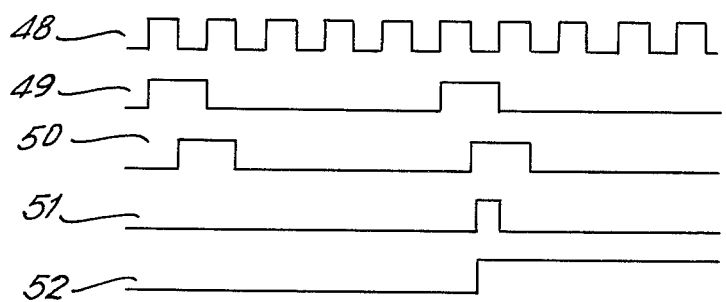
FIG. 6 is a timing chart of selected signal waveforms of the circuit of FIG. 5.

One embodiment of the construction of an integrated circuit block 13 in accordance with the invention is depicted in FIG. 4. In this figure, a glass substrate 14 is provided, which corresponds to lower substrate 8 of FIG. 1. Said lower substrate may also be formed of a transparent plastic. A source electrode 15 and a drain electrode 16 are formed on the glass substrate in spaced relation and a gate semiconductor 17 is deposited therebetween. A transparent insulating film 18 is deposited over the gate semiconductor 17 and adjacent portions of said source and drain electrodes. A gate electrode 22 is deposited on the transparent insulating film in registration with the region intermediate the source and drain electrodes. A thin film resistor element 19 is deposited on glass substrate 14 between drain electrode 16 and a conductive lead 20 is also deposited on said glass substrate for carrying the positive power source signal. A second conductive lead 21 is deposited on the glass substrate in electrical engagement with drain 15 for carrying the negative power source signal. Relatively thick insulating films 23 and 24 are deposited on the foregoing assembly except in an exposed region of the drain electrode 16 adjacent the connection thereof with resistor 19. A display electrode 25 is deposited on the substrate 14 overlying insulating films 23 and 24 and making electrical connection with drain electrode 16 at the junction with resistor 19, said display electrode corresponding to lower electrode segment 7 of FIGS. 1–3. A display cell integrated circuit capable of being formed by the thin film transistor and resistor techniques of FIG. 4 and adapted for use as the display integrated circuit 13 of FIG. 3 is depicted in FIG. 5. The circuit of FIG. 5 can be formed from a transparent integrated circuit using transmissive material such as the material used in thin film transistors. Driving integrated circuit 27, which corresponds to driving integrated circuit 13, has as one set of inputs, a clock signal and the inverse of the clock signal, said inverse clock signal being produced by means of an inverter 26. Driving integrated circuit 27 includes one stage of shift register, a memory circuit for displaying and a light-writing circuit. A similar integrated circuit block would be provided at each lower electrode segment 7. The one stage of shift register is defined by the circuit consisting of field-effect transistors 29, 30, 31 and 32, diodes 33 and 34 and capacitors 35 and 36. When a clock signal such as signal 48 of FIG. 6 is applied along the clock line, and a signal 49 (FIG. 6) is applied to the input of the shift register stage at the gate of transistor 29, an output corresponding to signal 50 of FIG. 6 is produced at the junction between diode 34 and transistor 32. Specifically, the input signal 49 is transmitted to the next stage delayed by one-half the period of clock signal 48. Inverter 37, and NAND gates 38 and 39 define a gate for transmitting the output of the shift register to a memory circuit as hereinafter described when the display timing pulse from the line labeled DISPLAY is applied. Photo-transistor 40 is a photo-sensitive device characterized by a substantial reduction in impedance between the source and drain when light impinges thereon. The photo-sensitive transistor is connected between a positive power source $V_{DD}$ and a resistor connected to a negative power source $V_{SS}$ (ground). An EXCLUSIVE OR gate 41 is provided with one input from NAND gate 38 and a second input from the junction between photo-transistor 40 and the associated resistor. Field-effect transistors 42, 43, 44 and 45 and resistors 46 and 47 define a memory circuit. The output from the shift register is transmitted to the drain of field-effect transistor 44 when the display timing pulse (from the DISPLAY line) is applied. When the impedance of photo-transistor 40 becomes low due to the application of light thereto, the drain output of field-effect transistor 44 becomes high and the display is energized by the application of an energizing signal to the corresponding lower electrode segment 7. A display timing pulse 51 is illustrated in FIG. 6, along with the output 52 from field-effect transistor 44, which represents the voltage applied to the electrode segment 7.

Figure 7:
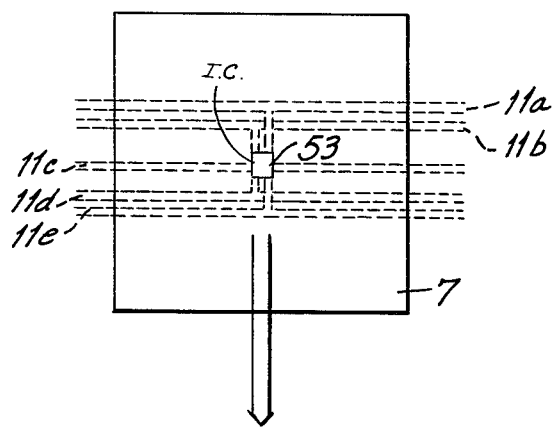
FIG. 7 is an enlarged view of a second embodiment of an electrode of FIG. 2 and the associated driving integrated circuit and leads.
Figure 8:
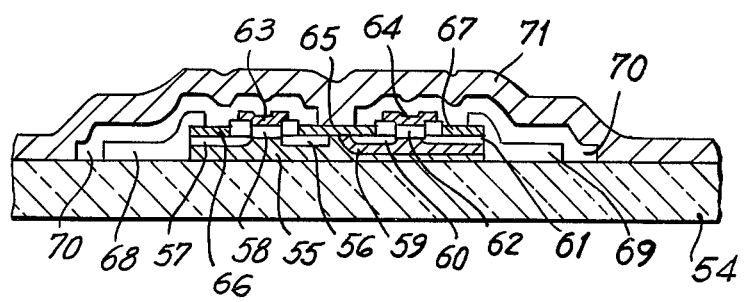
FIG. 8 is a cross sectional view of the structure of a MOS integrated circuit incorporated in the driving integrated circuit of FIG. 7.
Figure 9:
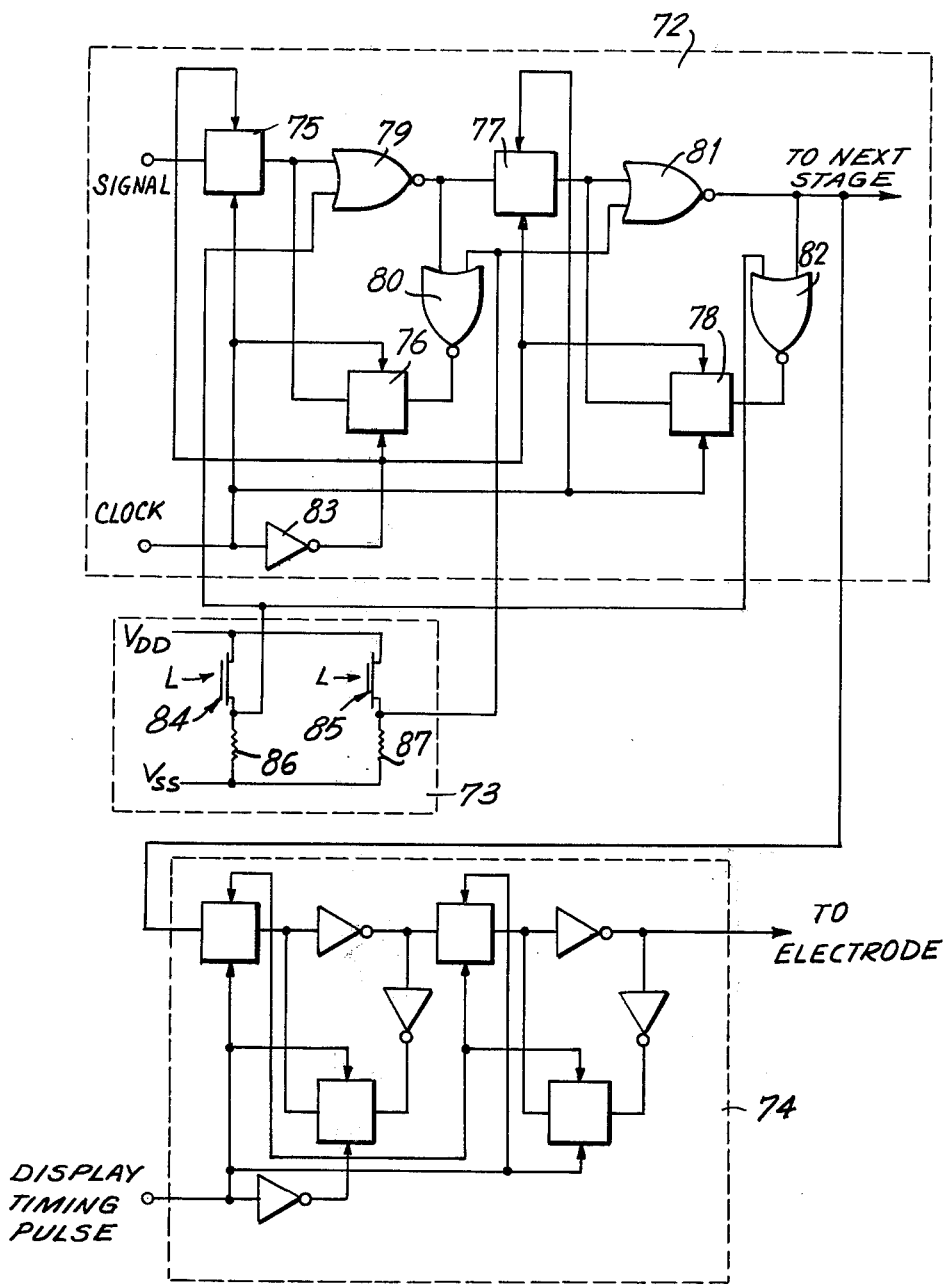
FIG. 9 is a circuit diagram of a driving integrated circuit constructed utilizing the principles of FIG. 8 and incorporated in the driving integrated circuit of FIG. 7.
Figure 10:
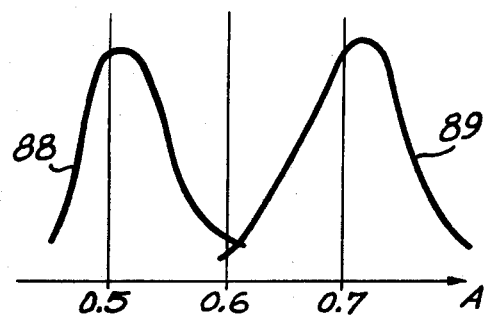
FIG. 10 illustrates the light sensitive characteristics of the photo-transistors of the circuit of FIG. 9.

Referring now to FIG. 7, a second embodiment of the driving integrated circuit in accordance with the invention is depicted. In this case, the driving integrated circuit 53 is formed from an integrated circuit block having an area substantially smaller than the area occupied by lower electrode segment 7. Driving integrated circuit 53 is formed from MOS (metal oxide semiconductor) integrated circuits. Each integrated circuit is itself nontransparent to the actuating radiation but since the size of the integrated circuit can be made small in relation to the size of each lower electrode segment 7, the picture quality of the display is not adversely influenced. A cross section illustrating the construction of the integrated circuit defining driving integrated circuit 53 is shown in FIG. 8. Said integrated circuit is formed of complementary MOS (CMOS). The CMOS is formed by growing a P-type silicon layer 55 on a transparent sapphire substrate 54. Portions of the P-type silicon layer outside of that require to define the integrated circuit required is removed by etching techniques so as to minimize the adverse influence upon the picture quality of the display. A drain region 56 and a source region 57 of N-type MOS are formed in the P-type silicon layer 55 through diffusing doner impurities. These areas are N+. A layer of silicon oxide ($SiO_2$) is formed over the portion of the silicon layer 55 intermediate the source and drain to define a gate insulator to define the N-type MOS transistor. In order to form P-type MOS transistors, an N-type inversion portion 59 is formed in the P-type silicon layer 55 by diffusing doner impurities. By further diffusion, drain region 60 and source region 61 are formed in the N-type inversion portion 59 in spaced relation and a gate insulating layer 62 is deposited on the portion of silicon layer 55 intermediate drain region 60 and source region 61. Gate electrodes 63 and 64 are respectively deposited on gate insulating layers 58 and 62 of the N-type and P-type MOS transistors respectively. A common drain electrode 65 electrically connecting the respective drains of the P-type and N-type MOS transistors is deposited on the surface of silicon layer 55 while respective source electrodes 66 and 67 are deposited on the respective sources 57 and 61 of the P-type and N-type MOS transistors. Power source supplying lines 68 and 69 are respectively connected to source electrodes 66 and 67. An insulating film 70 is deposited on the above-described structure except in the central region of drain electrodes 65. Electrode 71, which corresponds to lower electrode segment 7, overlies insulating film 70, makes electrical contact with drain electrodes 65, and extends over the surface of sapphire substrate 54 so as to cover an area substantially larger than the area of integrated circuit 53. FIG. 9 illustrates a circuit diagram of an embodiment of the driving integrated circuit in accordance with the invention which may be integrated as illustrated in FIGS. 7 and 8. In this circuit, a set-reset counter 72 of conventional construction is utilized as a shift register. Set-reset counter 72 includes transmission gates 75, 76, 77 and 78, NOR gates 79, 80, 81 and 82 and inverter 83, and serves as one stage of a shift register. The output of this circuit is applied to the next stage. Further, said output signal is applied to the associated electrode segment 7 through shift register 74 which serves as a memory circuit. Block 73 represents a circuit for writing and erasing the display. Two photo-transistors 84 and 85 are provided in block 73, but any element whose impedance is changed in response to applied radiation, such as light, can be substituted therefor. Each of the photo-transistors are respectively connected in series with resistors 86 and 87 between positive power source $V_{DD}$ and negative power source $V_{SS}$ so that a positive pulse is generated with a light L is applied thereto. In order to provide separate writing and erase functions, photo-transistor 84 is formed so as to respond to radiation of short wavelength as illustrated in response curve 88 of FIG. 10 while photo-transistor 85 is formed so as to be sensitive to radiation of long wavelengths as shown in characteristic curve 89 of FIG. 10. When short wavelength radiation, such as violet light, is applied to the driving integrated circuit in question, the output of shift register 72 becomes high due to the action of photo-transistor 84. When a long wavelength radiation is applied, such as red light, the output of shift register 72 becomes low due to the action of photo-transistor 85. If the wavelength of the light applied by the external radiation source is producible in two distinct wavelengths, write and erase functions can be readily performed. This permits, among other functions, the correction of a write error.

In addition to writing using the external radiation source, such as a light source, data can also be written into the display by applying data from the input signal terminal of the shift register. The data is displayed by applying a display timing pulse each time that the write or erase function is performed.

Figure 11:
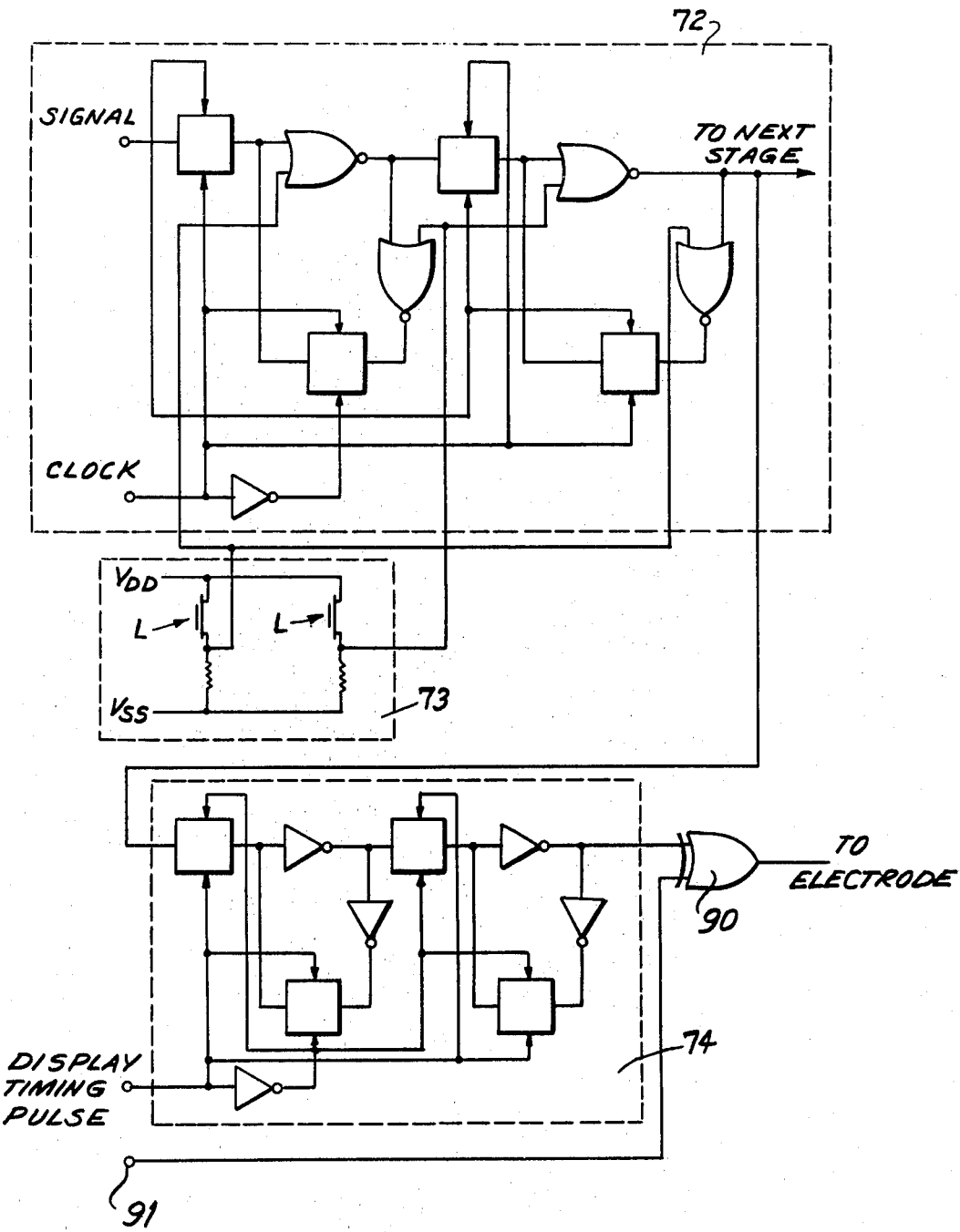
FIG. 11 is an alternate embodiment of a circuit diagram constructed in accordance with the construction of FIG. 8 and incorporated in the driving integrated circuit of FIG. 7.

FIG. 11 is a circuit diagram of a driving integrated circuit adapted for driving the display cell by alternating driving current. The circuit is substantially identical to the circuit of FIG. 9 and like reference numerals have been applied to like elements. The new circuitry consists of EXCLUSIVE OR circuit 90 receiving the output from memory circuit 74 and the A.C. signal for driving the liquid crystal which is applied to terminal 91. The A.C. driving signal is preferably a rectangular signal.

In order to obtain photo-transistors responsive to specific wavelength radiation, impurities of the desired spectral sensibility characteristic may be added to the material of the photo-transistor such as CdS and CdSe. Such elements are well known in the art. It is also possible to provide a light detecting circuit which also serves as a shift register by incorporating an element having the light or radiation-detecting function in a portion of a component of the shift register in accordance with the invention.

Figure 12:
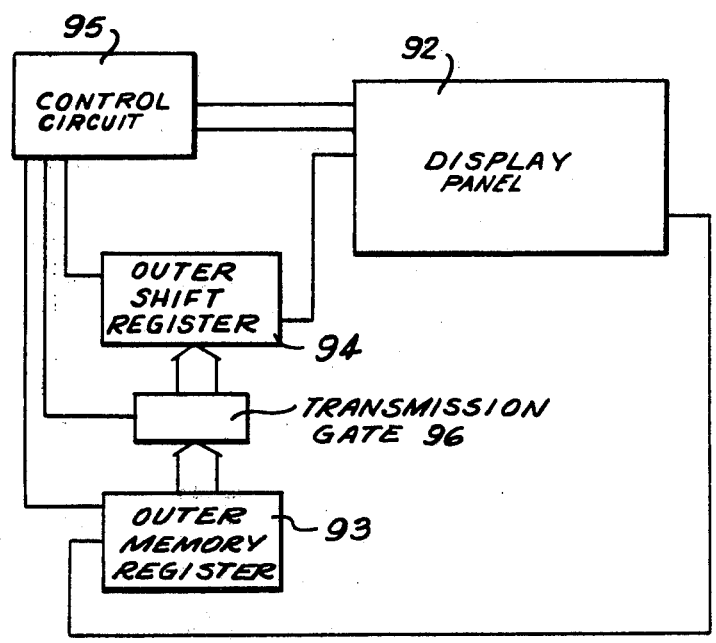
FIG. 12 is a block diagram of the display device in accordance with the invention including the display panel and external circuitry.

Turning now to FIG. 12, a block diagram of the entire display in accordance with the invention is depicted. A display panel 92 is provided with four inputs, namely the clock signals for the shift registers formed therein, the display timing pulse, the A.C. signal for driving the liquid crystal, and an output from the shift register of the last stage. The display device includes an outer memory register 93, transmission gate 96 and outer shift register 94, all positioned outside of display panel 92. The operation of the respective elements is controlled by control circuit 95 which provides the various clock pulses. Where it is desired to provide a display which not only performs a display function, but transmits data to other logic elements within the device and to other displays, the data displayed in the display panel would be transferred to said outer memory register 93 and stored therein semi-permanently. The stored date would be transferred again to the outer shift register 94 througgh transmission gate 96 so as to be written into the shift register. In effect, the display panel 92 can serve as an input-output device for a variety of apparatus wherein the data stored in memory register 93 may be operated upon and changed before redisplay. Further, in its role as an input device, a suitable set of data can be established in display panel 92 by operation of a light source and transferred to memory register 93, after which other data can be applied to the display panel.

The display device in accordance with the invention utilizes a passive type display substance such as a liquid crystal and permits data to be both written and erased by applying radiation from an exterior source independent of the display device from outside of the display panel. Further, the display panel is characterized by a thin construction and a low power consumption.

It will thus be seen that the objects set forth above, and those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A display device comprising a first substrate; a second substrate positioned in spaced relation to said first substrate; a first electrode mounted on said first substrate facing said second substrate; at least one second electrode mounted on said second substrate facing said first electrode; a display material disposed between said substrates and electrodes and adapted so that the region thereof in registration with at least the second electrode is rendered visually distinguishable from the adjoining regions of said material upon the selective energization of said electrodes; and at least one display cell driving circuit means mounted on said second substrate in the region of each of said second electrodes, each of said display cell driving circuit means including at least one radiation detecting means for detecting selectively applied radiation from outside of said display device and at least one shift register stage means coupled to said radiation detecting means for storing a data state representative of the detection of radiation by said radiation detecting means and coupled to the associated second electrode for energizing said electrodes in response to said detection of radiation by said radiation detecting means.

2. A display device as recited in claim 1, including a plurality of said second electrodes and associated display cell driving circuit means disposed on said second substrate to define an array.

3. A display device as recited in claim 2, wherein each of said second electrodes is disposed on said second substrate in substantially overlapping relationship with the associated display cell driving circuit means.

4. A display device as recited in claim 3, wherein said display cell driving circuit means is substantially formed of radiation-transparent materials.

5. A display device as recited in claim 4, wherein said display cell driving circuit means is formed from thin-film circuit elements deposited on said second substrate.

6. A display device as recited in claim 5, including a layer of transparent insulating material intermediate said second electrode and said thin-film display cell driving circuit means except in the region of electrical connection therebetween.

7. A driving circuit as recited in claim 3, wherein each of said display cell driving circuit means is formed of integrated circuit elements occupying an area on said second substrate substantially less than the area occupied by the associated overlapping second electrode.

8. A display device as recited in claim 7, wherein said integrated circuit means includes CMOS (complementary metal oxide semiconductor) transistors formed on a silicon layer deposited on said second substrate.

9. A display device as recited in claim 7, including an insulating layer intermediate said second electrode and the associated integrated display cell driving circuit means except in the region of electrical connection therebetween.

10. A display device as recited in claim 1, wherein said radiation detecting means is a light-sensitive device.

11. A display device as recited in claim 1, wherein said display cell driving circuit means includes first and second radiation detecting means, each being adapted to detect radiation of a wavelength different from the wavelength detected by the other of said radiation detecting means, said shift register stage means being coupled to both said first and second radiation detection means and being adapted to store a data state and energize said electrodes in response to the detection of radiation by said first radiation detecting device and to erase said data state and de-energize said electrodes in response to radiation detected by said second radiation detecting means.

12. A display device as recited in claim 1, including control circuit means for generating a clock signal and a display timing pulse; each of said display cell driving circuit means including memory circuit means coupled to said shift register means for receiving and storing the data state of said shift register in response to said display timing pulse from said control circuit means, said control circuit means being coupled to said shift register stage means for controlling the operation thereof.

13. A display device as recited in claim 12, wherein each of said display cell driving circuit means includes first and second radiation detecting means, each of said first and second radiation detecting means being adapted to detect radiation of a wavelength different from the wavelength detected by the other of said radiation detecting means, said shift register stage means being adapted to be placed in a data state for storage in said memory means and energization of said electrodes in response to the detection of radiation by said first radiation detecting means and being adapted to be placed out of said data state for erasing said memory means and de-energizing said electrodes in response to the detection of radiation by said second radiation detecting means.

14. A display device as recited in claim 12, said first and second substrates and the display material therebetween defining a display cell, said display device including memory register means disposed outside of said display cell and coupled to the display cell driving circuit means thereof for receiving therefrom and storing the data in the memory circuit means of said display cell driving circuit means; and outer shift register means disposed outside of said display cell and electrically connected to said display cell driving circuit means for applying in series the data of said exterior memory register means to the shift register stage means of said display cell driving circuit means.

15. A display device as recited in claim 14, wherein each of said display cell driving circuit means includes first and second radiation detecting means, each of said first and second radiation detecting means being adapted to detect radiation of a wavelength different from the wavelength detected by the other of said radiation detecting means, said shift register stage means being adapted to be placed in a data state for storage in said memory means and energization of said electrodes in response to the detection of radiation by said first radiation detecting means and being adapted to be placed out of said data state for erasing said memory means and de-energizing said electrodes in response to the detection of radiation by said second radiation detecting means.

16. A display device as recited in claim 1, wherein said display substance is a liquid crystal material.

17. A display device as recited in claim 16, wherein said liquid crystal material is characterized by positive dielectric anisotropy, the molecules of said liquid crystal material being oriented into a substantially 90° twisted arrangement between said first and second electrodes, and including a first linear polarizer plate mounted on the outer surface of said first substrate and a second linear polarizing plate mounted on the outer surface of said second substrate, the axes of polarization of said first and second linear polarizing plates being at substantially 90° to each other.

18. A display device as recited in claim 17, wherein said first and second substrates, and said first and second electrodes are transparent.

19. A display device as recited in claim 18, including a reflector mounted on the outer surface of said second linear polarizing plate.

20. A display device as recited in claim 1, wherein said display material is a PLZT (lead-lanthanum-zirconate-titanate ceramics) material.

* * * * *